United States Patent
Miyauchi et al.

(10) Patent No.: US 6,360,346 B1
(45) Date of Patent: Mar. 19, 2002

(54) STORAGE UNIT, METHOD OF CHECKING STORAGE UNIT, READING AND WRITING METHOD

(75) Inventors: Toshiyuki Miyauchi, Tokyo; Masayuki Hattori, Kanagawa, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/140,005

(22) Filed: Aug. 26, 1998

(30) Foreign Application Priority Data

Aug. 27, 1997 (JP) .............................. 9-231518
Aug. 27, 1997 (JP) .............................. 9-231519

(51) Int. Cl.$^7$ .............................................. G11C 29/00

(52) U.S. Cl. ...................... 714/763; 714/773

(58) Field of Search ................. 714/763, 773

(56) References Cited

U.S. PATENT DOCUMENTS

| | | | | |
|---|---|---|---|---|
| 4,648,091 A | * | 3/1987 | Gajjar ......................... | 371/37 |
| 4,661,955 A | * | 4/1987 | Arlington et al. ............. | 371/38 |
| 4,888,773 A | * | 12/1989 | Arlington et al. .......... | 371/40.2 |
| 5,351,210 A | * | 9/1994 | Saito ..................... | 365/189.01 |
| 5,475,693 A | * | 12/1995 | Christopherson et al. .. | 371/10.2 |
| 5,500,826 A | * | 3/1996 | Hsu et al. .............. | 365/230.01 |
| 5,596,589 A | * | 1/1997 | Thomsen et al. .......... | 371/37.8 |
| 5,740,177 A | * | 4/1998 | Miyata ...................... | 371/10.2 |
| 5,754,567 A | * | 5/1998 | Norman .................... | 371/40.18 |
| 5,870,414 A | * | 2/1999 | Chaib et al. ................ | 371/43.4 |
| 5,933,436 A | * | 8/1999 | Tanzawa et al. ........... | 371/39.1 |
| 5,938,787 A | * | 8/1999 | Stark .......................... | 714/755 |
| 6,014,755 A | * | 1/2000 | Wells et al. .................... | 714/8 |
| 6,095,410 A | * | 8/2000 | Anderson et al. ........... | 235/380 |

OTHER PUBLICATIONS

Mitola, "The Software Radio Architecture", IEEE Communications Magazine, May 1995, pp. 26–38, May 1995.*

Chen et al., "The (64, 32, 27) Hermitian Code and its Application to Fading Channels", Proceedings 1995 IEEE International Symposium on Information Theory, Sep. 1995, p. 97.*

Klein et al., "A Sysrtematic (16, 8) Code for Correcting Double Errors, and Detecting Random Triple Errors", Proceedings of the IEEE Southeastcon '96, pp. 284–288, Apr. 1996.*

Walker, "The Nordstrom–Robinson Code is Algebraic–Geometric", IEEE Transactions on Information Theory, vol. 43, No. 5, Sep. 1997, pp. 1588–1593.*

* cited by examiner

Primary Examiner—Stephen M. Baker
(74) Attorney, Agent, or Firm—Frommer Lawrence & Haug LLP; William S. Frommer; Darren M. Simon

(57) ABSTRACT

A storage unit is provided which is capable of preventing the occurrence of readout errors even if two or more errors arise within a code, and a storage unit checking method is offered which can improve the productivity. Write data produced by BCH-encoding and compacting data s1 inputted into a flash memory, capable of correcting two errors within a code in an encoder, is written in a cell array. Data read out from the cell array 3 is error-corrected and decoded in an error correction/encoder to generate output data. In the check to be made at manufacturing (or putting on the market), examination data written in advance is successively read out by one block so that the errors within each code is counted. If the number of errors assumes 1 or less, that code is subjected to error correction, whereas the block including a code whose error number is 2 or more is treated as a defective block. The acceptance or failure is determined depending upon, for example, whether the rate of the number of defective blocks to the total number of blocks is below or not less than 1%.

9 Claims, 11 Drawing Sheets

STORAGE UNIT, METHOD OF CHECKING STORAGE UNIT, READING AND WRITING METHOD

BACKGROUND OF THE INVENTION

1. Field of the Invention

The present invention relates to a storage unit such as a data-erasable (reloadable) non-volatile semiconductor memory, and a method of checking or examining the storage unit.

2. Description of the Related Art

In recent years, semiconductor memories such as a flash memory have come into widespread use for storage units where data is electrically erasable and rewritable.

The flash memory is a semiconductor memory composed of a cell array made by arranging a large number of (usually, approximately 65,000,000 cells) storage elements (memory cells) each comprising charge storage layers formed in a laminated condition on a semiconductor substrate and control gates for storing information. The information (data) is stored in relation to the quantity of charge to be accumulated in the aforesaid charge storage layers.

A significant object about such a semiconductor memory is to prevent the decrease in its reliability with the increase in integration and densification, particularly, for example, the occurrence of cell defectives due to the increase in the number of write/read operations and with the passage of time.

For this reason, an error correcting circuit using an error correcting code such as a hamming code has been incorporated into the interior of a semiconductor memory.

Such error correction is a way in which redundant data, called checking data, is added to information data to be stored which in turn, is encoded so that errors existing in the encoded data (code data) are corrected through the use of the checking data.

FIG. 1 is a block diagram showing an arrangement of a prior flash memory into which incorporated an error corrector using the aforesaid compacted hamming code.

This flash memory, designated at numeral 70, is made up of an encoder 61 for hamming-encoding data s21 inputted to correct one error within a code, a cell array 63 serving as a storage section to store write data s22 manning-encoded in the encoder 61, and a hamming decoder 65 for decoding readout data s23 read out from the cell array 63 and hamming-encoded.

Writing data in this flash memory 70 takes place as follows. That is, the inputted data s21 is first put in the encoder 61 which in turn, adds 10-bits checking data at every inputted data comprising 512 bits as shown in FIG. 2, which will be described herein later, to convert the data into a compacted hamming code, and subsequently, outputs it as the write data s22. This write data s22 is written the cell array 63.

On the other hand, reading out data from the flash memory 70 is done as follows. The readout data s23 read out from the cell array 63 is inputted into the hamming code decoder 65, and if the number of errors in one code is below 1, is outputted as output data s24 after being subjected to error correction.

FIG. 2 shows one example of information data to which checking data is added.

For instance, in the case of using compacted hamming code, checking data 32 of 10 bits is added to information data 31 of 512 bits to make a code comprising 522 bits in total, so that one error occurring within that code becomes correctable.

Through the use of this error correction, even if the cell defective occurs to some extent due to a change with the passage of time of a storage unit such as a semiconductor memory, it is possible to prevent the presence of readout error in written data.

However, for the correction of many errors, the error correcting code is required to have much checking error being generally redundant data, and hence, many cells are needed to use and simultaneously, the error corrector becomes larger in circuit scale.

FIG. 3 exemplifies an arrangement of a cell array of the aforesaid flash memory.

In this example, the storage area of the cell array 63 is divided into blocks 65, 66, 67, . . . , 69, each of which is composed of areas called cells. For instance, in the block 65, numerals 65a, 65b, . . . represent the cells, respectively.

As mentioned above, in general, the whole cell array is divided into some blocks, and usually, is made up of 1000 blocks each including approximately 65000 cells.

In this cell array, the block including a defective cell is detected as a defective block. Further, in the examination of the cell array to be done before being put on the market, if the rate of the defective blocks to the total number of blocks of the cell array is below a predetermined value (usually, approximately 1%), that cell array is put on the market as an acceptance.

FIG. 4 is an illustration of one example of processing procedures of a prior checking method for detecting defective cells of a semiconductor memory such as flash memory to count the number of defective cells.

The processing starts at a step ST21 to set the number of defective blocks at zero.

Subsequently, a step ST22 follows to read out data previously written as checking data by the quantity corresponding to one block.

Furthermore, a step ST23 follows to decide whether or not there is an error within the data corresponding to one block read out in the step ST22. If there is the error, the processing advances to a step ST24 to increment the count value forming the number of defective blocks by one, then followed by a step ST25. On the other hand, if the decision shows no error, the operational flow directly proceeds to a step ST25.

The step ST25 is for deciding or not the all the blocks undergo the error detection. If no completion of the error detection for all the blocks, the operational flow returns to a step ST22 to repeat the processing up to the step ST25. On the other hand, if the error detection covers all the blocks, the operational flow goes to a step ST26.

In the step ST26, decision is made, for example, on whether the rate of the number of defective blocks to the total number of blocks of the semiconductor memory is below 1%. If satisfying this requirement, an acceptance decision is made in a step ST27, whereas, of not satisfying the requirement, a defect decision is made in a step ST28. The examination terminates at this time.

However, since the above-mentioned prior hamming code employed as an error correcting code for a semiconductor memory such as a flash memory can correct only one error in the data corresponding to one code, there is a problem in that its error correction ability is insufficient for attaining a high reliability.

In addition, as mentioned before, as the inferiority (defective condition) of the semiconductor memory, in addition to the passage-of-time inferiority such as the cell inferiority attributed to the increase in the write/erase frequency, there is the cell inferiority occurring in the manufacturing processes.

For this reason, since the prior semiconductor memory using the aforesaid error corrector can reduce the cell inferiority resulting from a change with the passage of time but can not reduce the inferiority occurring in manufacturing, difficulty is experienced to prevent the deterioration of the productivity due to the impairment of the yield.

Moreover, because of the use of the error correcting code such as the hamming code which can correct one error within a code, in the case of correcting the readout error caused by the cell inferiority at the manufacturing, the surplus power for correcting the readout error resulting from the change with the passage of time may disappear.

SUMMARY OF THE INVENTION

Accordingly, the present invention has been developed in order to eliminate such problems, and it is an object of this invention to provide a storage unit with a high reliability which is capable of preventing the occurrence of readout error in written data even if two or more errors occur within a code due to the change with the passage of time or the like.

Another object of this invention is to provide a storage unit with a high reliability which has an error correction ability to correct the errors resulting from the inferiority in manufacturing and the errors caused by the inferiority resulting from a change with the passage of time, and further to provide a storage unit checking method which is capable of improving the yield at the production to enhance the productivity.

For working out the above-mentioned problems, the present invention provides a storage unit comprising a storage section for storing data encoded with an error correcting code capable of correcting errors, the number of which assume up to n (n≧2), within a predetermined data unit and an error correcting section for correcting errors in the encoded data read out from the storage section, with the storage section and the error correcting section being placed within one package, and further, provides a reading method for this storage unit.

In addition, for the purpose of solving the above-mentioned problems, the present invention provides a storage unit further comprising an encoding section for encoding data with an error correcting code capable of correcting errors up to n (n≧2) within a predetermined data unit, with the data encoded in the encoding section being stored in the storage section, and further, provides a writing method for this storage unit.

Furthermore, for solving the above-mentioned problems, the present invention provides a storage unit which further comprises a first data unit converting section for converting the encoded data into a data unit comprising 2 or more bits when the encoded data is read out in a bit unit from the storage section, with the error correcting section being made to correct errors up to n (n ≧2) within the encoded data constituting the data unit comprising 2 or more bits, and further, provides a reading method for this storage unit.

Still further, for solving the above-mentioned problems, the present invention provides a storage unit which further comprises an encoding section for encoding data in a data unit comprising 2 or more bits and a second data unit converting section for converting the data encoded in the data unit comprising 2 or more bits into a bit unit, and further, provides a writing method for this storage unit.

Still further, for solving the above-mentioned problems, the present invention provides a storage unit in which, when the number of errors within the data unit in the encoded data is below m (m≦n), correction is made for these errors, and when the number of errors within the data unit in the encoded data is equal to or more than m, a storage area of the storage section storing the encoded data is treated as a defective area in a predetermined block unit, and further, provides a reading method for this storage unit.

Still further, for solving the above-mentioned problems, the present invention provides a storage unit in which the error correcting section is equipped with error number detecting means for detecting the number of errors within each data unit in the encoded data and for outputting the detection result, and further, provides a reading method for this storage unit.

Besides, for solving the above-mentioned problems, the present invention provides a storage unit in which the error correcting section includes control means for executing control through the use of an external control signal not to perform the error correction.

Moreover, for solving the above-mentioned problems, the present invention provides a method of checking a storage unit comprising a storage section and an error correcting section for correcting errors in encoded data read out from the storage section and encoded with an error correction code capable of correcting errors up to n (n≧2) within a predetermined data unit, with the storage section and the error correcting section being placed within one package, the checking method comprising an error number detecting step of detecting the number of errors within the encoded data, and a defective area specifying step of, when the number of errors within a data unit in the encoded data is m or more, determining a storage area of the storage section storing the encoded data as a defective area in a predetermined block unit.

Thus, according to this invention, there is provided a high-reliability storage unit having an error correction ability to correct the errors caused by the inferiority at the manufacturing and the errors caused by the inferiority resulting from a change with the passage of time, and further, there is provided a storage unit checking method capable of enhancing the yield at the production to improve the productivity.

DETAILED DESCRIPTION OF THE PREFERRED EMBODIMENTS

Preferred embodiments of the present invention will be described hereinbelow with reference to the drawings.

The following description will be made in terms of a case that this invention is applied to a flash memory, where an error correcting code is used which is capable of correcting errors up to 2 within a predetermined data unit in encoded data read out from a storage section (memory cell) of the flash memory.

Figure 1:
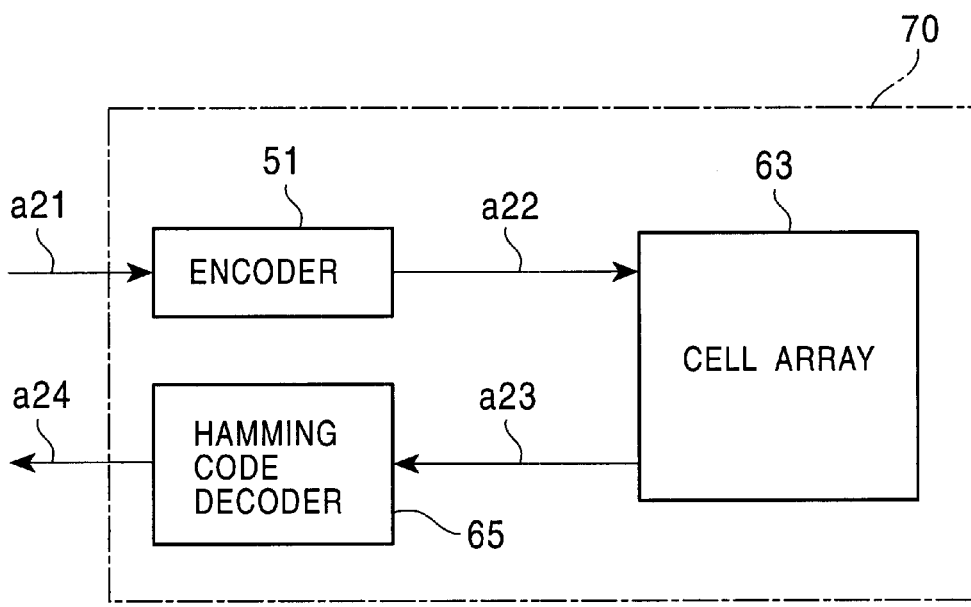
FIG. 1 is a block diagram showing an arrangement of a prior flash memory using a hamming code.
Figure 2:
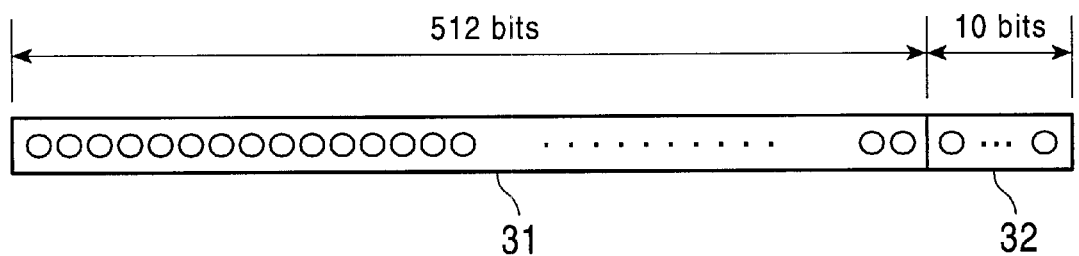
FIG. 2 is an illustration for explaining a compacted hamming code.
Figure 3:
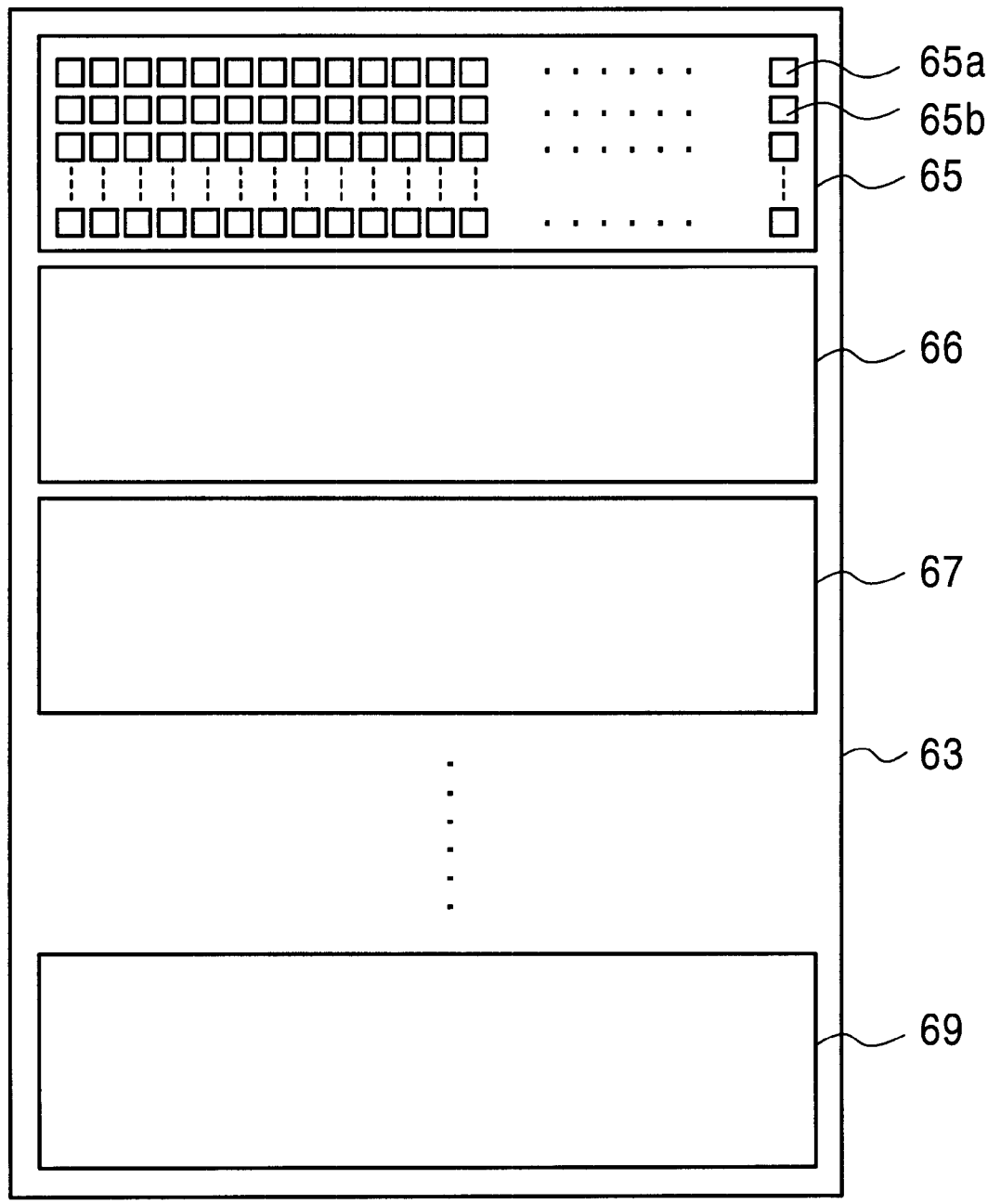
FIG. 3 is an illustration for explaining a structure of a cell array of a semiconductor memory.
Figure 4:
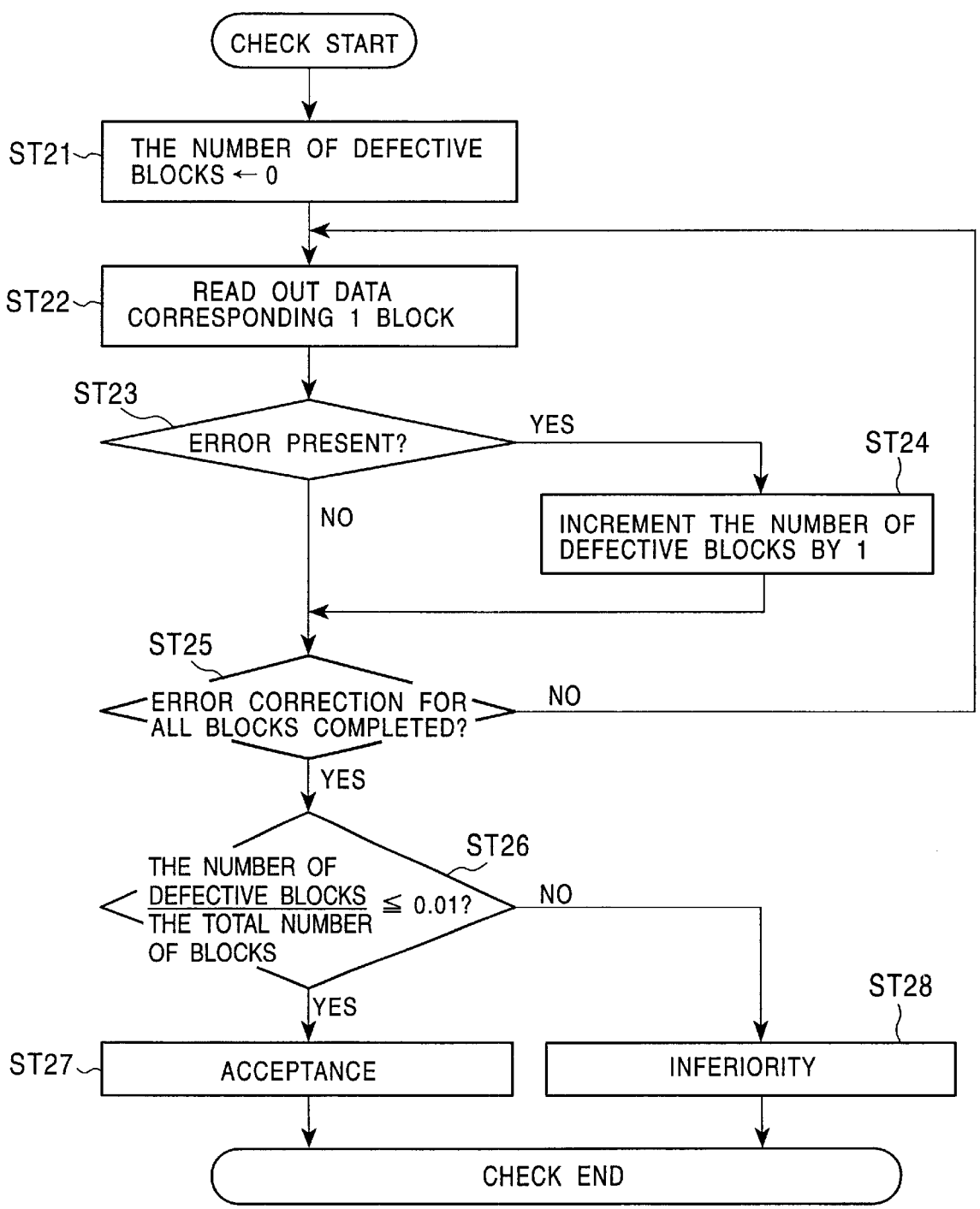
FIG. 4 is a flow chart showing one example of prior procedures for a method of checking a semiconductor memory.
Figure 5:
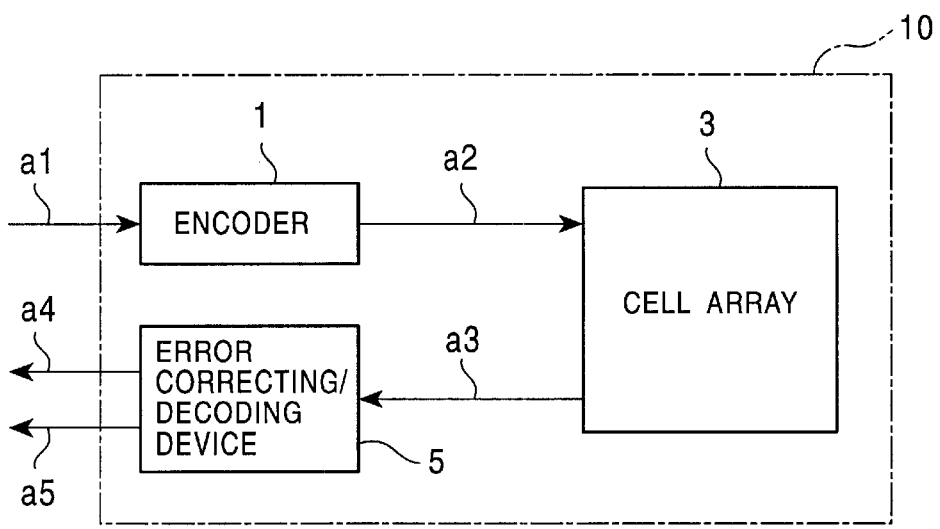
FIG. 5 is a block diagram showing an example of arrangements of a flash memory according to the present invention.

FIG. 5 is a block diagram showing an arrangement example of a flash memory forming a storage unit according to an embodiment of this invention.

This flash memory, designated at numeral 10, is made up of an encoder 1 for accomplishing BCH-encoding and compacting processing, whereby two errors in a code is correctable, on data s1 inputted, a cell array 3 constituting a storage section for storing write data s2 BCH-encoded in the encoder 1, and an error correcting/decoding device 5 for decoding readout data s3 BCH-encoded and read out from the cell array 3.

This BCH (Bose-Chaudhuri-Hocquenghem) code, when a divisor of qm−1 is taken as n and primitive n power route of 1 is taken as α, signifies a q-unknowns (element) cyclic code with a code length n in which the monic polynomial G(x) that the degree on a Galois field GF (q) having successive h (<n) powers αL, αL+1, . . . , αL+h−1 as routes is at a minimum is taken as a generation polynomial.

Furthermore, the compacted BCH code is produced by compacting the aforesaid BCH code. In general, a compacted code is a (n−L, k−L) linear code C' obtained in a manner that a (n, k) linear code C which has a code length of n and which has k information symbols is encoded in a state where L information symbols of are placed as zero which in turn, is removed therefrom.

Besides, the description about the BCH code and the code compactification has been made in the documents including "Code Theory" (Electronic Information Communication Institute) written by Hideki Imai.

Figure 6:
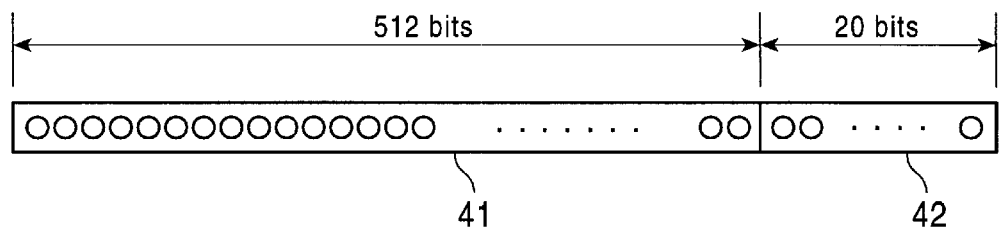
FIG. 6 is an illustration of one example of data to be encoded with a compacted BCH code.

FIG. 6 shows one example of information data encoded with a compacted BCH code.

In the BCH encoding, when information data 41 is made with 512 bits, checking data 42 of 20 bits is added thereto so that the overall length of the resultant code assumes 532 bits. Further, this code is handled as a data unit.

Secondly, a description will be given hereinbelow of an data writing operation and a data reading operation in the flash memory shown in FIG. 5.

Input data s1 to be inputted to the flash memory 10 is first put in the encoder 1. The encoder 1 adds 20-bit checking data to the inputted data s1 at every 512 bits for the conversion into a compacted BCH code in which two errors are correctable and outputs the compacted BCH code as write data s2 to be written. This write data s2 is written in the cell array 3.

Furthermore, data s3 read out from the cell array 3 is inputted into an error correcting/decoding device 5. This error correcting/decoding device 5, when the number of errors within the code is below 2, corrects the errors and subsequently outputs the data as an output data s5.

In addition, the error correcting/decoding device 5 has a function to detect the number of errors in each data unit of the encoded data to output the detection result as an error number signal s4.

This arrangement can detect and count, as a defective block, the block including a code that the value of the error number signal s4 assumes 2 or more and the block that outputs data different from the inputted data due to the aforesaid error correction.

Furthermore, a description will be taken hereinbelow of an error correcting/decoding device of the storage unit according to this invention.

Figure 7:
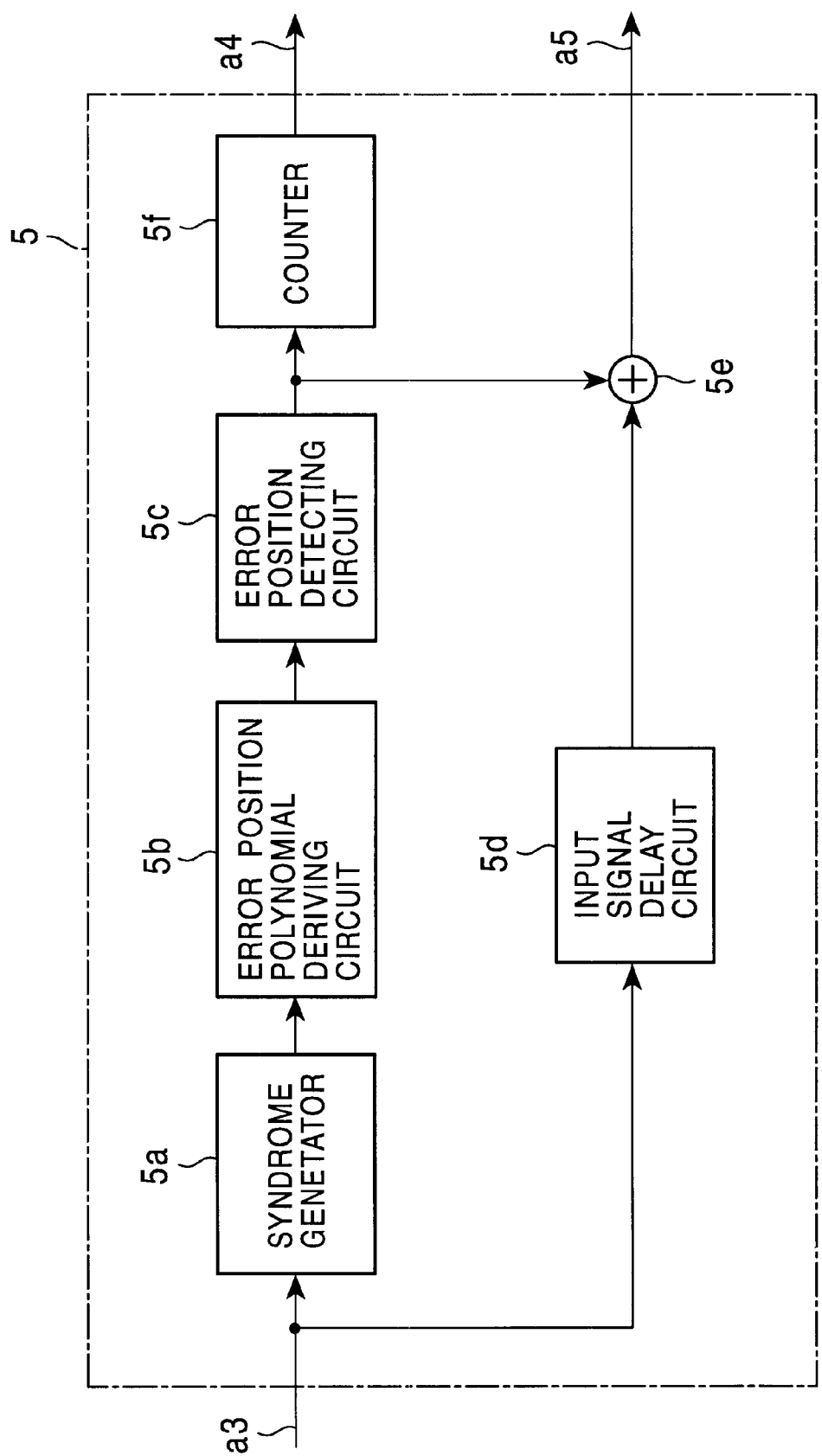
FIG. 7 is an illustration of an example of arrangement of an error correcting/decoding device to be incorporated into the flash memory shown in FIG. 5.

FIG. 7 shows an arrangement example of the error correcting/decoding device 5 of the aforesaid flash memory 10.

This error correcting/decoding device 5 is made to use a two-error correction compacted BCH code as shown in FIG. 6.

The readout data read out from the cell array 3 is put into a syndrome generator 5a.

The syndrome generator 5a calculates a syndrome on the basis of the readout data s3 and outputs a syndrome signal. This syndrome signal is inputted into an error position polynomial deriving circuit 5b.

The error position polynomial deriving circuit 5b derives an error position polynomial through the use of a method such as the Euclidean method of mutual division (Euclidean algorithm) to output error position polynomial information to an error position detecting circuit 5c.

The error position detecting circuit 5c detects an error position within a code according to a method such as a solution formula and a chain search and outputs an error position signal where the error position is represented by "1". This error position detecting circuit 5c performs the detection utilizing the property that the event that an error exists in the ith element of the code is equal in value to the event that the value obtained by substituting the primitive route a to the ith power into the error position polynomial assumes zero. Further, utilizing the property that, when correctly decoded, the degree of the equation coincides with the number of solutions and the positions of i corresponding to the solutions are all fall within the compacted code, the error position detecting circuit 5c checks whether the decoding is correctly done or not, and conducts the processing not to fulfill the error correction if inconsistency occurs. As the typical method for this portion, there are a method according to the chain search and a method using the solution formula.

Besides, a counter 5f counts the number of "1" outputted from the error position detecting circuit 5c to output the count value as the error number signal s4.

Furthermore, the readout data s3 inputted into this error correcting/decoding device 5 is also inputted into an input signal delay circuit 5d. The input signal delay circuit 5d delays the inputted readout data s3 by a necessary time to output an input delay signal.

Still further, the input delay signal from the input signal delay circuit 5d and the error position signal from the error position detecting circuit 5c are both inputted into an adder 5e where the bit at the error position in the readout data s3 is inverted to correct the error of the readout data s3 and further to output it as output data s5.

Incidentally, the description about the syndrome, the error position polynomial, the Euclidean method of mutual division, and the chain search and others has been made in the foregoing document "Code Theory" (Electronic Information Communication Institute) written by Hideki Imai, or in the other documents.

Moreover, a description will be made hereinbelow of a storage unit according to another embodiment of this invention. The following description will be made of an example in which this invention is applied to a flash memory.

Figure 8:
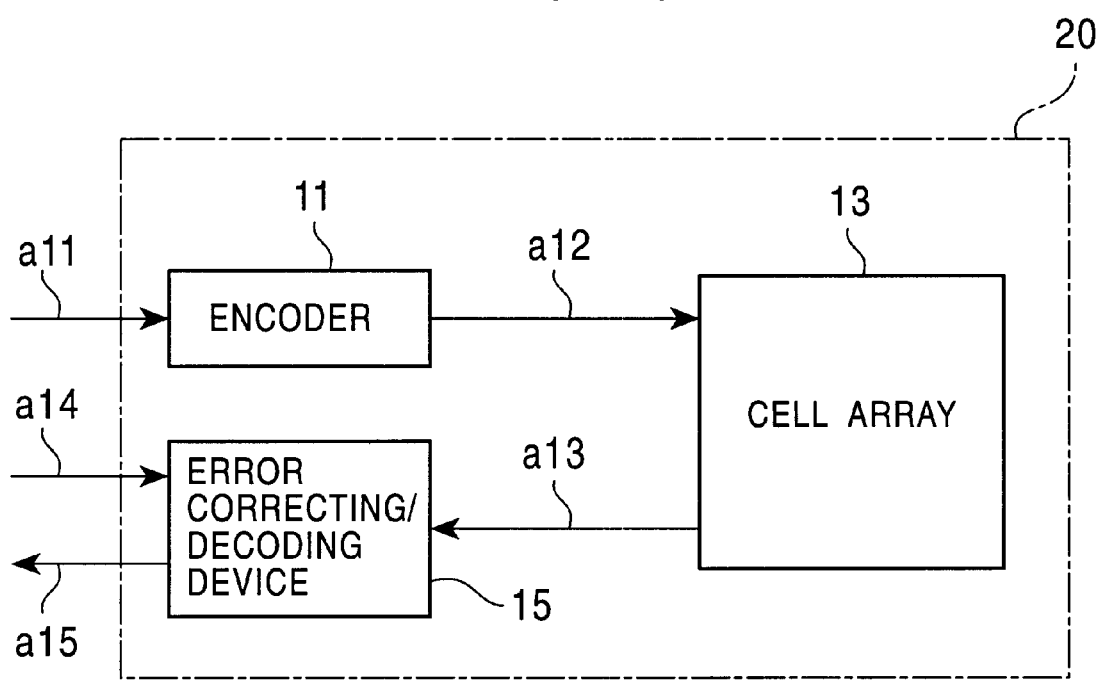
FIG. 8 is a block diagram showing another arrangement example of a flash memory according to this invention.

FIG. 8 is a block diagram showing an arrangement example of a flash memory according to the another embodiment of this invention.

This flash memory, designated at numeral 20, is made up of an encoder 11 for accomplishing an encoding operation on input data s11 with an error correcting code whereby two errors in a code is correctable, a cell array 13 constituting a storage section for storing write data s12 encoded in the encoder 11, and an error correcting/decoding device 15 for decoding readout data s3 subjected to the encoding and read out from the cell array 13 for accomplishing the error correction, with these components of the flash memory 20 being provided within one package.

In this flash memory 20, the write of data is made as follows. The input data s11 is first inputted into the encoder 11. The encoder 11 adds checking data of 20 bits at every 512 bits of the input data s11 to convert the data into a compacted BCH code so that two errors are correctable, and outputs the conversion result as the write data s12. This write data s12 is written in the cell array 13.

On the other hand, the readout of data is done as follows. the readout data s13 read out from the cell array 13 is inputted into the error correcting/decoding device 15.

This error correcting/decoding device 15, when the value of an correction non-operating signal s14 being a control signal from the external assumes "0", corrects the error if the number of errors within the code is one, and outputs the corrected data as the output data s15.

With this arrangement, at the manufacturing of the flash memory 20, in a manner of comparing the input data with the output data in a state where the value of the correction non-operating signal s14 is set to "1" to inhibit the error correction, it is possible to detect and count, as a defective block, the block including a code with 2 or more errors.

Figure 9:
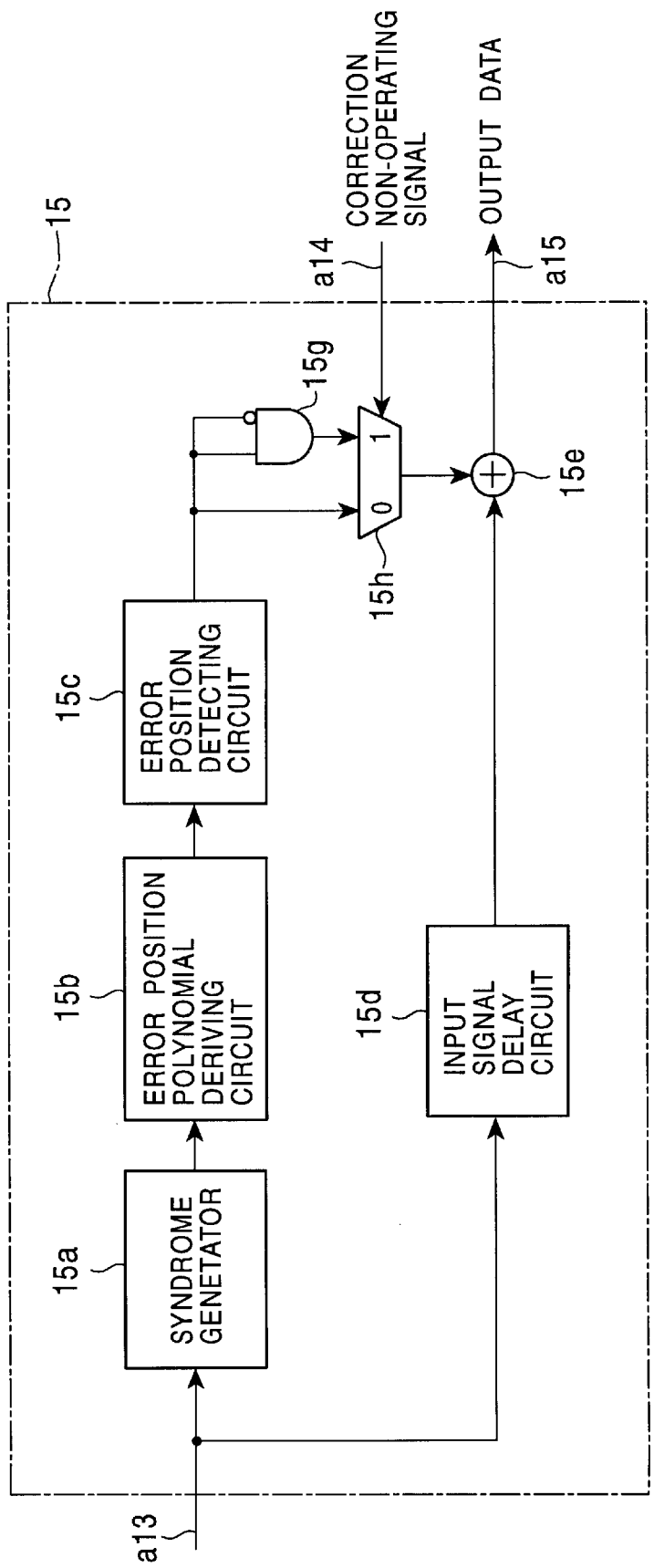
FIG. 9 is an illustration of an example of arrangement of an error correcting/decoding device to be built in the flash memory shown in FIG. 8.

FIG. 9 is an illustration of an arrangement example of the error correcting/decoding device 15 of the aforesaid flash memory.

This error correcting/decoding device 15 uses a two-error correction compacted BCH code based on information data of 512 bits as shown in FIG. 6, and substantially has the same structure as that of the error correcting/decoding device 5 shown in FIG. 5.

The readout data s13 read out from the cell array 13 is first inputted into a syndrome generator 15a.

The syndrome generator 15a calculates a syndrome on the basis of the readout data s13 to output a syndrome signal. This syndrome signal is put in an error position polynomial deriving circuit 15b.

The error position polynomial deriving circuit 15b derives an error position polynomial through the use of a method such as the Euclidean method of mutual division to output error position polynomial information to an error position detecting circuit 15c.

The error position detecting circuit 15c detects an error position within the readout data s13 according to a method such as a solution formula and a chain search and outputs an error position signal where the error position is represented by "1".

In addition, the same readout data s13 as that inputted into the error correcting/decoding device 15 is also given to an input signal delay circuit 15d. The input signal delay circuit 15d delays the inputted readout data s13 by a necessary time to output an input delay signal.

Furthermore, the input delay signal from the input signal delay circuit 15d and the error position signal from the error position detecting circuit 15c are both inputted into an adder 15e where the bit at the error position of the readout data s13 is inverted to correct the error of the readout data s13, thereby outputting the readout data s13 as output data s15.

Besides, the error position signal from the error position detecting circuit 15c is inputted into a selector 15h and further inputted as an inverting input and a non-inverting input into an AND gate 15g. Further, the selector 15h selects the output (=0) of the AND gate 15g when the value of a correction non-operating signal s14 being a control signal inputted from the external assumes "1", whereas selecting the error position signal from the error position detecting circuit 15c when the value of the correction non-operation signal s14 takes "0", with the selected signal being given to the adder 15e.

Whereupon, when the correction non-operating signal s14 shows "1", the error correction of the readout signal s13 does not take place.

Secondly, a description will be taken hereinbelow of a different embodiment using, as an error correcting code, a compacted Reed-Solomon code (which will be referred hereinafter to as a RS code) whereby two errors are correctable in terms of a data unit comprising 2 or more bits. The description will be made as to a case that this invention is applied to a flash memory.

Figure 10:
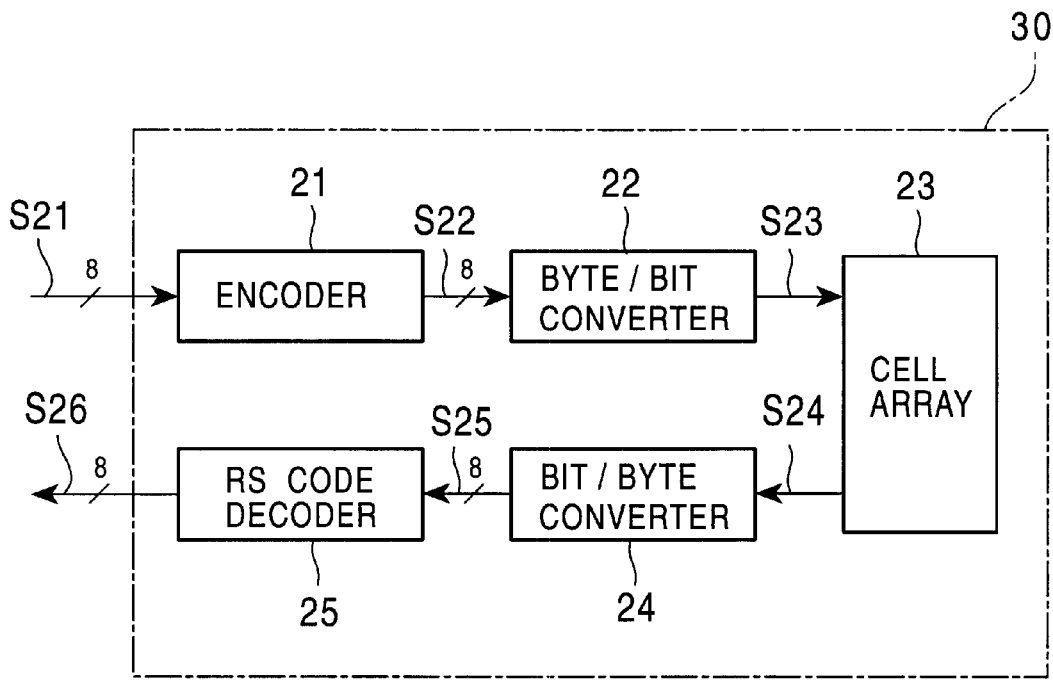
FIG. 10 is an illustration of a different arrangement example of a flash memory according to this invention.

FIG. 10 is a block diagram showing an arrangement example of a flash memory according to the different embodiment of this invention.

This flash memory, designated at numeral 30, is composed of an encoder 21 for accomplishing an encoding operation on input data s21 with a RS code whereby two errors in a code is correctable, a cell array 23 constituting a storage section for storing write data RS-encoded in the encoder 21, a RS-code decoder (decoding device) 25 for decoding readout data, subjected to the RS-encoding and read out from the cell array 23, a byte/bit converter 22 for converting code data s22, obtained by RS-encoding in the encoder 21 and lying in a byte unit (=8 bits), into write data 23 in a bit unit, and a bit/byte converter 24 for converting readout data s24, read out from the cell array 23 and existing in a bit unit, into data s25 in a byte unit.

In this flash memory 30, the write of data is accomplished as follows. That is, the input data s21 is inputted in the encoder 21 in a byte unit (8 bits), and checking data of 4 bytes is added thereto at every 128 bytes, and after being converted into a compacted RS code whereby two errors are correctable, the data is outputted as code data s22.

The code data s22 is inputted into the byte/bit converter 22 constituting a first data unit converting section to be converted into bit-unit data and to be outputted as the write data s23. This write data s23 is written in the cell array 23.

On the other hand, the readout of data is done as follows. That is, the readout data s24 read out from the cell array 23 is inputted into the bit/byte converter 24 organizing a second data unit converting section to be outputted as byte data s25 after being collected at every 8 bits.

The byte data s25 is put in the RS-code decoder 25. The RS-code decoder 25 corrects the byte data s25 if the number of error bytes is below 2, and subsequently, outputs the corrected data as output data s26 in a byte unit.

In addition, although not shown, the RS-code decoder 25 has a function to detect the number of errors in each data unit of the aforesaid code data and to output an error number signal, or has a function to, when the value of the correction non-operating signal forming a control signal from the external assumes "0", correct the code data if the number of errors in the code is one and subsequently to output it as the output data s25.

Incidentally, the RS code and the compacted RS code is a code for accomplishing error correction in a data unit comprising a plurality of bits, and in this case, is made to perform the error correction in a byte (8 bits) unit.

Concretely, it is one of non-two-unknowns BCH code, and corresponds to the BCH code in the case of n =q−1. That is, when the primitive q−1 power route of 1 is taken as α, it is a q-unknowns cyclic code with a code length n =q−1 in which the monic polynomial G(x) that the degree on a Galois field GF (q) having αL, αL+1, ..., αL+h−1 as routes is at a minimum is taken as a generation polynomial.

Incidentally, the description about the RS code has been made in the documents including the foregoing "Code Theory" written by Hideki Imai.

Figure 11:
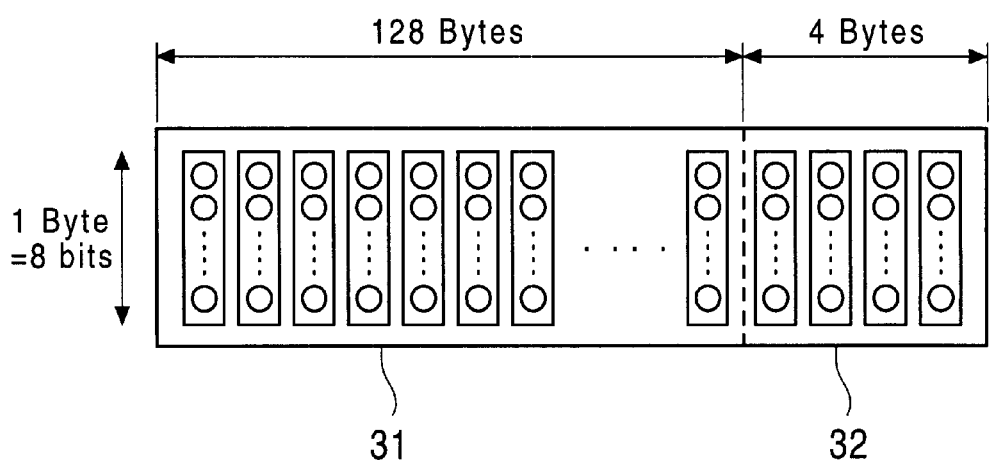
FIG. 11 is an illustration for describing RS-encoding and compacting processing.

FIG. 11 shows one example of information data compacted-BCH-encoded to allow the correction of two errors.

As shown in FIG. 11, when 8 bits are taken as 1 byte, if information data 31 is composed of 128 bits, checking data 32 of 4 bytes is added the information data 31, so that the overall length of the code comes to 132 bytes (=1056 bits).

Furthermore, in conjunction with the case of being applied to the aforesaid flash memory, a description will be made hereinbelow of a checking method for a storage unit according to an embodiment of this invention.

Figure 12:
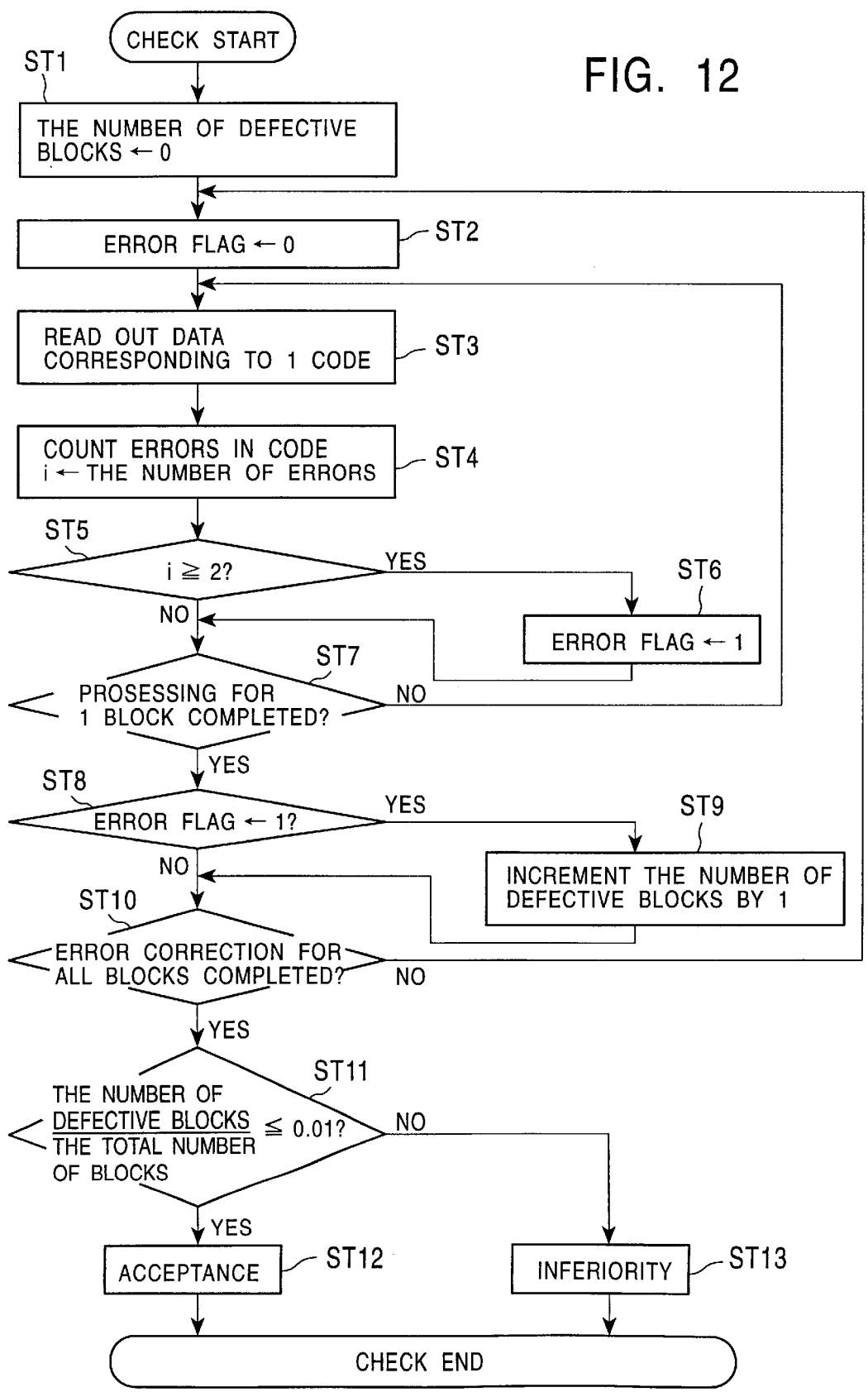
FIG. 12 is a flow chart showing a basic procedure to be taken in a storage unit checking method according to this invention.

FIG. 12 is a flow chart showing a basic processing procedure of a checking method for a storage unit according to this invention.

The processing starts at a step ST1 to set the number of defective blocks at zero, and then followed by a step ST2 to set an error flag at zero.

Subsequently, in a step ST3, the data previously written as checking data is read out by the quantity corresponding to one block, and in a step ST4, the number of errors within a code is counted and set as i.

Then, a step ST5 is executed in order to decide whether or not the number i of errors obtained in the step ST4 is 2 or more. If the decision in this step ST5 shows that the number i of errors obtained is not less than 2, a step ST6 follows to set the error flag to 1. On the other hand, if being below 2, the operational flow advances to a step ST7.

The step ST7 is for confirming whether the aforesaid processing for one block is completed or not. If the answer of the step ST7 shows no completion, the operational flow returns to the step ST3 to repeat the processing up to the step ST7. On the other hand, if showing completion, the operational flow proceeds to a step ST8.

The step ST8 is for deciding whether or not the error flag is set to 1. If the error flag indicates 1, a step ST9 follows to increment the count value of defective blocks by 1. On the other hand, if the error flag does not indicate 1, the operational flow goes to a step ST10.

Following this, the step ST10 is executed to decide whether or not the error detection is made for all the blocks. In the case of no completion of the error detection for all the blocks, the operational flow returns to the step ST2 to repeatedly conduct the processing up to the step ST10. Meanwhile, for the completion of the error detection for all the blocks, the operational flow goes to a step ST11.

The step ST11 is done for deciding whether or not the rate of the number of defective blocks to the total number of blocks of the cell array is, for example, below 1%. If the decision shows the satisfaction of this condition, a step ST13 follows to make a decision to its acceptance. If not satisfying this condition, a step ST13 follows to make a decision to its inferiority, thereafter terminating this checking procession.

Figure 13:
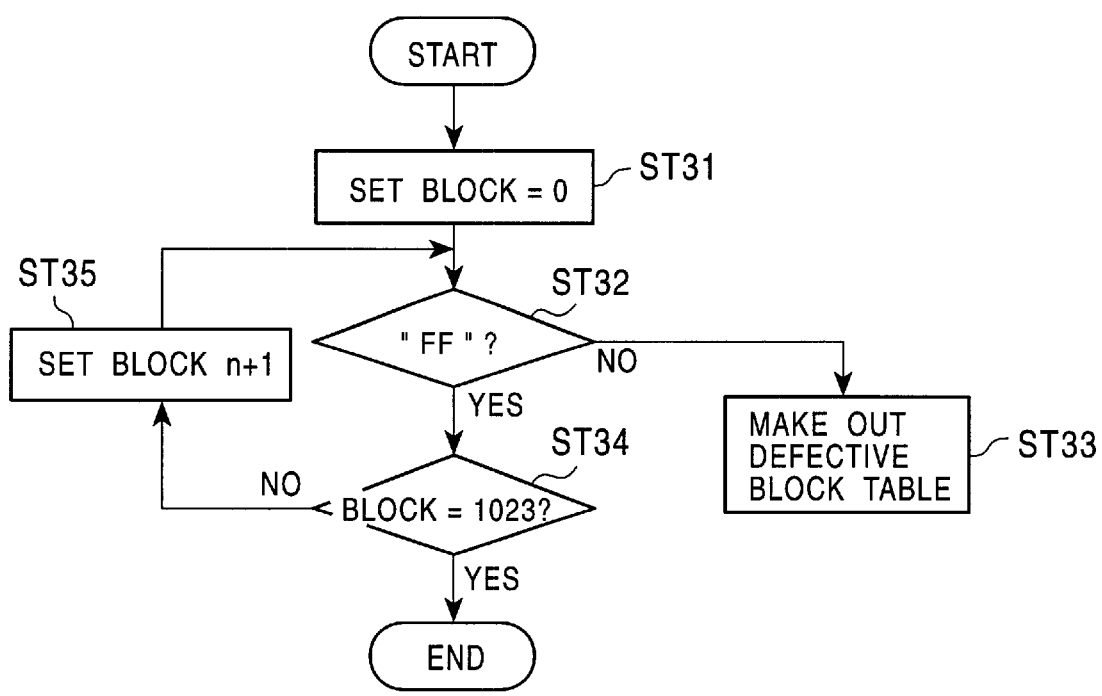
FIG. 13 is a flow chart showing one example of procedures of a defective block deciding method.

FIG. 13 shows one example of the procedures for the decision on defective blocks in the above-mentioned processing.

A semiconductor memory is set to FFh because the written data is erased before being put on the market. Thus, by utilizing this fact, the decision on the defective blocks is successively made from the block whose block number is taken as 0 according to the following procedure.

A step ST31 is first executed to set the block number "Block" at zero.

Subsequently, a step ST32 follows to decide whether the readout data from the aforesaid block is "FF" or not. If the readout data is not "FF", a step ST33 is done to make out a defective block table so that the defective blocks are discriminable. Further, 00h data is written in the defective blocks at random. On the other hand, if the decision of the step ST32 indicates that the readout data is "FF", the operational flow goes to a step ST34.

The step ST34 is for the purpose of deciding whether or not the block number "Block" reaches the number (for example, 1023) representative of the final block. If not reaching this final block number, a step ST35 follows to increment the number by 1, and the processing from the step ST32 is conducted repeatedly. Meanwhile, if coming to the final block number, this processing terminates.

Moreover, a description will be made hereinbelow of the effects of the error correction in the flash memory to which this invention is applied.

In the following description, let it be assumed that the information data corresponding to 65536 cells is treated as one block and the cell array is composed 1000 blocks. In addition, let it be supposed that the write/readout of the data in/from the memory cells are done in a block unit.

First, on the condition that the probability that the cell which was normal at the manufacturing becomes a defective cell after the write/erase were done 1000000 times is 0.0001%, the comparison between the probabilities that the block inferiority occurs after the write/erase are done 1000000 times is made hereinbelow.

Since one block includes data corresponding to 128 codes, the probability that a defective block occurs in the case of the use of the hamming code becomes approximately 0.0018% as given by the following equation.

$$1-\{(1-1.0\times10^{-6})^{522}+522\times1.0\times10^{-6}\times(1-1.0\times10^{-6})^{521}\}^{128}=1.8\times10^{-5} \quad (1)$$

On the other hand, the probability that a defective block occurs in the case of the use of a compacted BCH code whereby two errors are correctable becomes approximately 0.00000032 as given by the following equation (2).

$$1-\left\{\sum_{i=0}^{2}532C_i(1.0\times10^{-6})^i(1-1.0\times10^{-6})^{521-i}\right\}^{128}=3.2\times10^{-9} \quad (2)$$

As mentioned above, if the data written in the storage section of the storage unit is encoded with an error correcting code which can correct errors up to n (n≧2) within a predetermined data unit and the error correction is done, the reliability noticeably improves as compared with the prior storage unit using the hamming code.

Secondly, a description will be made hereinbelow of the probability that a defective block occurs in the case of the use of a compacted RS code whereby two errors are correctable.

Assuming that the inferiority of each bit occurs in no correlation, the byte error rate to be taken for when 8 bits are collected to make 1 byte is given by the following equation (3).

$$1-(1-1.0\times10^{-6})^8=8.0\times10^{-6} \quad (3)$$

In this case, since 1 block includes data corresponding to 64 codes, the probability of the occurrence of a defective block becomes approximately 0.0000012% as given by the following equation (4).

$$1-\left\{\sum_{i=0}^{2}132C_i(8.0\times10^{-6})^i(1-8.0\times10^{-6})^{132-i}\right\}^{64}=1.2\times10^{-8} \quad (4)$$

Accordingly, even in the case of using the compacted RS code which can correct two errors, the reliability rises considerably as compared with the prior storage unit using the hamming code.

Figure 14A:
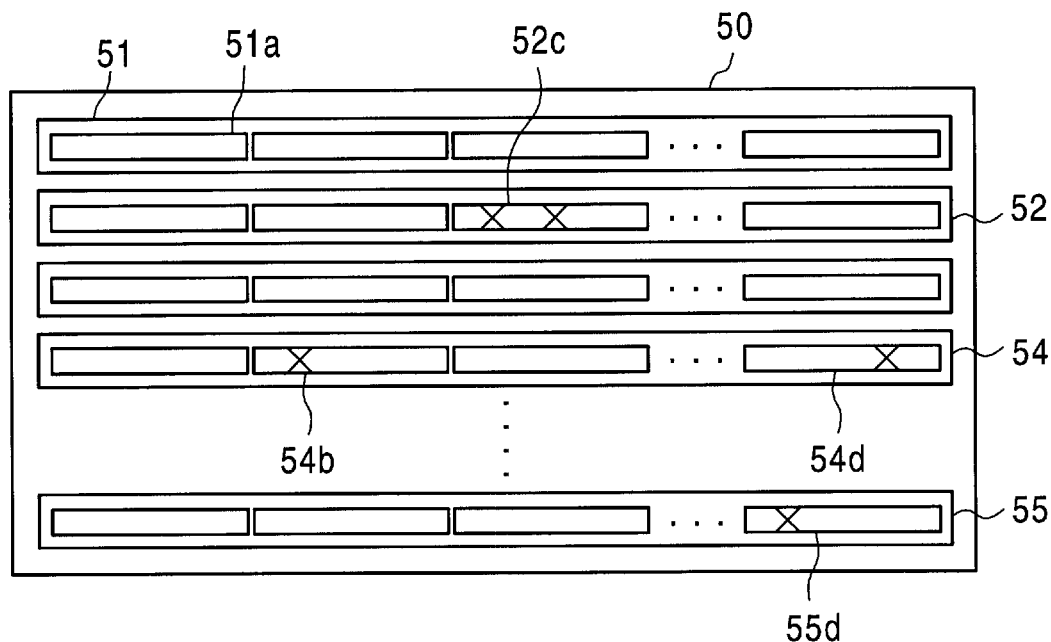
FIGS. 14A and 14B illustratively show a state of a semiconductor memory to which this invention is applied.
Figure 14B:
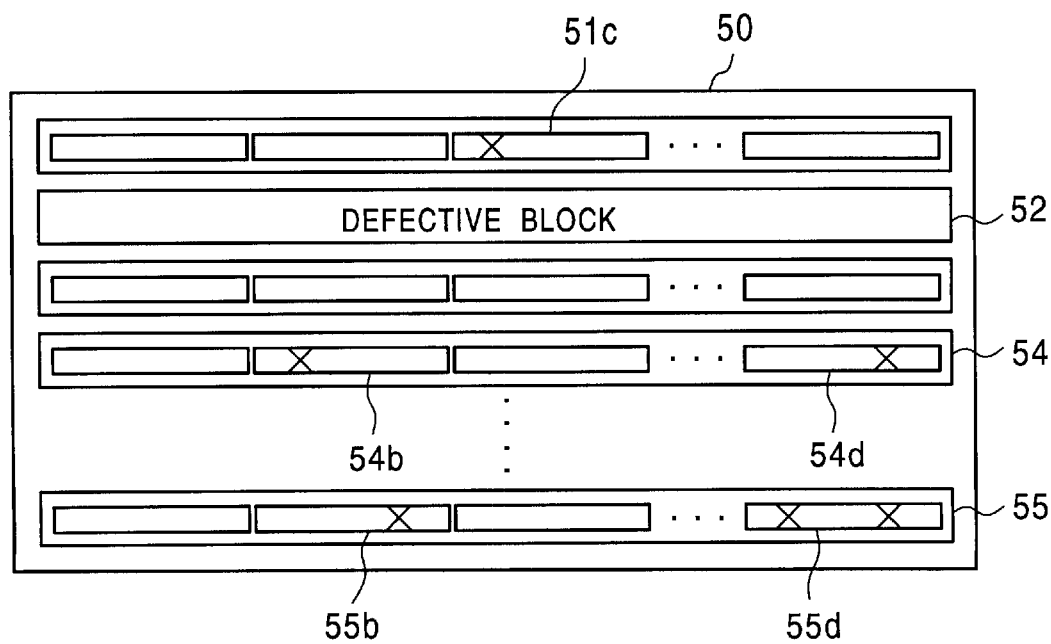

FIGS. 14A and 14B illustratively show states of a flash memory based upon the above-described storage unit checking method according to this invention.

FIG. 14A illustratively shows a state of the flash memory at manufacturing (placing on the market). In this flash memory designated at numeral 50, two errors exist within a code 52c, and if these two errors are corrected with an error correcting code whereby two errors are correctable, the correction ability of the error correcting code is completely used up, so that difficulty is encountered to correct errors which can occur due to a change with the passage of time. For this reason, the block 53 including the code 52c in which two errors exist is treated as a defective block and as an unusable area.

However, for codes 54b, 54d, 55d and others including only one error, even if the error correction therefor is accomplished with the error correcting code whereby two errors are correctable, since the error correction ability still remains so that the error occurring due to a change with the passage of time is correctable. Accordingly, the blocks respectively including these codes can be put on the market without being treated as defective blocks. And, the yield increases to improve the productivity as compared with the prior semiconductor memory using an error correcting code which allows the correction of only one error within a code.

FIG. 14B illustratively shows a state where the aforesaid flash memory 50 has been put to use for a while after the manufacturing. In this case, there is, as one example, shown the case that a cell inferiority occurs in the codes 51c, 55b and 55d which did not have any cell inferiority when being placed on the market.

Although one cell inferiority already occurs in the code 55d when being put on the market, even if one cell inferiority further occurs due to a change with the passage of time, the error correction is still possible, with the result that this flash memory 50 is still usable. Moreover, since the number of errors occurring in each of the codes 51, 55 is one, the correction ability still remains after the error correction, and even if the cell inferiority further increases by one, it is possible to prevent the occurrence of the readout error until the number of errors within the code comes to 3 or more.

The effects of this invention will be described hereinbelow with the probability of the occurrence of a defective block.

In the following description, let it be assumed that the information data corresponding to 65536 cells is taken as 1 block and the cell array is divided into 1000 blocks. In addition, let it be assumed that the probability that the cell inferiority occurs at the manufacturing is 0.00002% and the probability that the cell, which was normal at the manufacturing, becomes a defective cell after the write/erase are done 1000000 times is 0.000001%.

First, a comparison with the prior semiconductor memory will be made in terms of the memory inferiority rate at the manufacturing. In the case of no installation of an error correcting circuit, since one block comprises 65536 cells, the probability that the block inferiority occurs becomes approximately 1.3% as given by the following equation (5).

$$1-(1-2.0\times10^{-7})^{65536}=1.3\times10^{-2} \quad (5)$$

Accordingly, the probability that the rate of the number of defective blocks to the total number of blocks come to below 1% becomes approximately 25% according to the following equation (6).

$$\sum_{i=0}^{10}1000C_i(1.3\times10^{-2})^i(1-1.3\times10^{-2})^{1000-i}=0.25 \quad (6)$$

That is, 75% of the semiconductor memories manufactured results in defective products.

On the other hand, if the presence of only one cell inferiority in the data corresponding to one code is permitted, the probability that the block inferiority occurs becomes as expressed by the following equation (7) because the data corresponding to 128 codes is included in one block.

$$1-\{(1-2.0\times10^{-7}+532\ 2.0\times10^{-7}\times(1-2.0\times10^{-7})^{531}\}^{128}=7.2\times10^{-7} \quad (7)$$

That is, it is possible to lower the block inferiority occurrence probability to 0.000072%. Accordingly, the probability that the rate of the number of defective blocks to the total number of blocks becomes below 1% is given by the following equation (8), so that approximately 100% of the semiconductor memories manufactured can be placed on the market.

$$\sum_{i=0}^{10}1000C_i(7.2\times10^{-7})^i(1-7.2\times10^{-7})^{1000-i}=1.00 \quad (8)$$

As found from the above, the present invention can sharply improve the yield of the semiconductor memories.

Secondly, evaluation will be made as to the defective block occurrence probability when the write/erase are done 1000000 times.

In the case of no installation of an error correcting circuit in a semiconductor memory, the probability that a defective block occurs becomes approximately 0.066% as given by the following equation (9).

$$1-(1-1.0\times10^{-8})^{65536}=6.6\times10^{-4} \quad (9)$$

On the other hand, consideration is given to the case that a maximum of two errors are corrected after being placed on the market under the employment of this invention.

There is a possibility that one defective cell exists in the data corresponding to one code. However, assuming that one effective cell already exists in each of all the codes, the probability that a defective block appears is approximately 0.00000018% according to the following equation (10).

$$1-\{(1-1.0\times10^{-8})^{531}+531\times1.0\times10^{-8}\times(1-1.0\times10^{-8})^{530}\}^{128}= 1.8\times10^{-9} \quad (10)$$

Accordingly, a semiconductor memory based upon this invention can reduce the probability that a defective block appears due to a change with the passage of time, thus improving the reliability.

Although the above-described embodiment of this invention employs n=2 and m=1, it is considered that the values of m and n are changed in accordance with the status of the occurrence of inferiority at the manufacturing and the status of the occurrence of inferiority resulting from a change with the passage of time.

For instance, in cases where much cell inferiority occurs at the manufacturing while less cell inferiority occurs due to a change with the passage of time, setting as n=2 and m=2 is useful for improving both the error correcting ability and productivity. On the contrary, in cases where less cell inferiority occurs at the manufacturing so that the yield is sufficiently high with no error correction, setting as n=2 and m =0 can improve the reliability against the change with the passage of time through the error correction ability.

Besides, the values of n and m are not limited to these values, but it is also possible that n and m are set to satisfy $n \geq 2$ and $m \leq n$.

Moreover, although in the above-described embodiment an encoder and an error correcting device are built in the package of a semiconductor memory, it is also acceptable to employ various modifications, for example, a modification where the encoder is located outside the semiconductor memory when necessary.

Furthermore, although in the above-described embodiment a flash memory is taken as the storage unit according to this invention, but the storage unit according to this invention is not limited to the flash memory, but this invention is applicable to various types of storage units.

Besides, for correcting more errors through the use of an error correcting code, since in general there is a need to provide much checking data being redundant data, in the case that the error correction is applied to a semiconductor memory as mentioned before, there is a problem in that many memory cells are necessary and the error correcting circuit increases in scale. In addition, the circuit in which the error correction is done through the use of an error correcting code such as a compacted BCH code and a compacted RS code whereby two errors are correctable usually becomes larger in scale than an error correcting circuit using the hamming code.

However, owing to the recent progress of circuit technology, in the case of a circuit using approximately 10000 gates, the incorporation thereof into a semiconductor memory is sufficiently feasible, and the error correcting code mentioned above does not actually create a problem in circuit scale.

Furthermore, although in the above-described embodiment a compacted BCH code or compacted RS code whereby two errors are correctable is used as an error correcting code, the error correcting code is not limited to these, but it is also possible to employ, for example, a convolution code, a Reed-Muller code, a QR code, a Golay code and others, in addition to non-linear codes such as a Nordstrom-Robinsosn code, a Kerdock code and a Preprata code.

Since the storage unit according to this invention can correct 2 or more cell inferiorities occurring within a code due to a change with the passage of time, it is possible to prevent the occurrence of readout errors in the data written. Thereupon, a higher reliability is attainable as compared with the prior storage unit using the hamming code.

In addition, according to this invention, in terms of code data encoded with an error correcting code whereby errors up to n ($n \geq 2$) in a predetermined data unit are correctable and read out from the storage section, the error correction is made if the number of errors in the data unit of the aforesaid code data is below m ($m \leq n$), whereas, if the number of errors in the data unit of the aforesaid code data is not less than m, the storage area of the aforesaid storage section from which that code data is read out is inhibited to use, and therefore, it is possible to provide a high-reliability storage unit having an error correcting ability to correct both the errors resulting from the inferiority at the manufacturing and errors caused by the inferiority resulting from a change with the passage of time, and further to provide a storage unit checking method which is capable of improving the yield at the production to increase the productivity.

What is claimed is:

1. A storage unit having flash memory and integrated error correction placed within one package, comprising:
    an encoding section for encoding data in 512 bit units with an error correcting code of 20 bits for correcting up to 2 errors within each 512 bit unit;
    a storage section for storing data encoded by said encoding section;
    an error correcting section for correcting errors in the encoded data read out from said storage section; comprising:
        a syndrome generator for generating a syndrome signal calculated on the basis of the encoded data read out from said storage section;
        a polynomial deriving circuit for deriving an error position polynomial based on said syndrome signal;
        an error position detecting circuit for detecting an error position based on said error position polynomial and outputting an error position signal indicating the position of errors within each 512 bit unit;
        a counter for counting the number of errors indicated by said error position signal;
        a delay circuit for delaying a copy of the encoded data read out from said storage section; and
        an adder for adding said error position signal to the delayed encoded data thereby correcting errors in the data; and
    a decoding section for decoding the data corrected by said error correction section.

2. A storage unit as defined in claim 1, further comprising a correction non-operating signal for disabling the correction of data by said error correcting section.

3. A storage unit as defined in claim 1, wherein said storage section is composed of a plurality of storage elements.

4. A storage unit as defined in claim 1, wherein said error correcting code is a shortened BCH code.

5. A method of error correction for a storage unit having flash memory and integrated error correction placed in one package, said method comprising the steps of:

encoding data in 512 bit units with an error correcting code of 20 bits for correcting up to 2 errors within each 512 bit unit;

storing data encoded in said encoding step in a storage section;

correcting errors in the encoded data read out from said storage section by:

generating a syndrome signal calculated on the basis of the encoded data read out from said storage section;

deriving an error position polynomial based on said syndrome signal;

detecting an error position based on said error position polynomial and outputting an error position signal indicating the position of errors within each 512 bit unit;

counting the number of errors indicated by said error position signal;

delaying a copy of the encoded data read out from said storage section; and adding said error position signal to the delayed encoded data thereby correcting errors in the data; and decoding the data corrected in said error correcting step.

6. A method as defined in claim 5, further comprising a control step of controlling the correction of data on the basis of an external control signal.

7. A storage unit having flash memory and integrated error correction placed within one package, comprising:

an encoding section for encoding data in 128 byte units with an error correcting code of 4 bytes for correcting up to 2 errors within each 128 byte unit;

a storage section for storing data encoded by said encoding section;

an error correcting section for correcting errors in the encoded data read out from said storage section; comprising:

a syndrome generator for generating a syndrome signal calculated on the basis of the encoded data read out from said storage section;

a polynomial deriving circuit for deriving an error position polynomial based on said syndrome signal;

an error position detecting circuit for detecting an error position based on said error position polynomial and outputting an error position signal indicating the position of errors within each 128 byte unit;

a counter for counting the number of errors indicated by said error position signal;

a delay circuit for delaying a copy of the encoded data read out from said storage section; and an adder for adding said error position signal to the delayed encoded data thereby correcting errors in the data; and a decoding section for decoding the data corrected by said error correction section.

8. A storage unit as defined in claim 7, wherein said error correcting code is a shortened Reed-Solomon code.

9. A method of error correction for a storage unit having flash memory and integrated error correction placed in one package, said method comprising the steps of:

encoding data in 128 byte units with an error correcting code of 4 bytes for correcting up to 2 errors within each 128 byte unit;

storing data encoded in said encoding step in a storage section;

correcting errors in the encoded data read out from said storage section by:

generating a syndrome signal calculated on the basis of the encoded data read out from said storage section;

deriving an error position polynomial based on said syndrome signal;

detecting an error position based on said error position polynomial and outputting an error position signal indicating the position of errors within each 128 byte unit;

counting the number of errors indicated by said error position signal;

delaying a copy of the encoded data read out from said storage section; and adding said error position signal to the delayed encoded data thereby correcting errors in the data; and decoding the data corrected in said error correcting step.

* * * * *